United States Patent
Berberich

(10) Patent No.: US 7,906,974 B2
(45) Date of Patent: Mar. 15, 2011

(54) METHOD FOR CHECKING AN INDUCTIVE LOAD

(75) Inventor: Reinhold Berberich, Frankfurt (DE)

(73) Assignee: Siemens VDO Automotive AG, Regensburg (DE)

( * ) Notice: Subject to any disclaimer, the term of this patent is extended or adjusted under 35 U.S.C. 154(b) by 622 days.

(21) Appl. No.: 11/990,062

(22) PCT Filed: Jul. 25, 2006

(86) PCT No.: PCT/EP2006/064616
§ 371 (c)(1),
(2), (4) Date: Feb. 4, 2008

(87) PCT Pub. No.: WO2007/014875
PCT Pub. Date: Feb. 8, 2007

(65) Prior Publication Data
US 2010/0156432 A1  Jun. 24, 2010

(30) Foreign Application Priority Data
Aug. 4, 2005  (DE) .......................... 10 2005 036 769

(51) Int. Cl.
*G01R 31/02* (2006.01)
*G01R 31/08* (2006.01)
(52) U.S. Cl. ........................................ 324/537; 324/522
(58) Field of Classification Search .................. 324/537, 324/522
See application file for complete search history.

(56) References Cited

U.S. PATENT DOCUMENTS

| | | | |
|---|---|---|---|
| 4,439,806 A | 3/1984 | Brajder | |
| 4,541,389 A | 9/1985 | Kosak et al. | |
| 5,243,296 A | 9/1993 | Ando et al. | |
| 5,708,578 A * | 1/1998 | Stoddard et al. | ................ 363/98 |
| 5,723,958 A | 3/1998 | Boll et al. | |
| 7,548,070 B2 * | 6/2009 | Forster et al. | ................ 324/543 |

FOREIGN PATENT DOCUMENTS

| | | |
|---|---|---|
| DE | 34 36 776 | 4/1986 |
| DE | 3436776 | 4/1986 |
| DE | 43 29 919 | 3/1995 |
| DE | 41 36 415 | 11/1996 |

OTHER PUBLICATIONS

German Office Action dated Mar. 23, 2006 issued in corresponding application No. 10 2005 036 769.0.
International Search Report dated Jan. 17, 2007 issued in corresponding application No. PCT/EP2006/064616.
Written Report dated Jan. 17, 2007 issued in corresponding application No. PCT/EP2006/064616.

* cited by examiner

*Primary Examiner* — Amy He
(74) *Attorney, Agent, or Firm* — Cohen Pontani Lieberman & Pavane LLP

(57) ABSTRACT

A full-bridge circuit includes a first, second, third and fourth switch element. According to the method the checking includes at least one measuring process. For the at least one measuring process either only the second or only the third switch element or only the first and the second switch element or only the third and the fourth switch element is/are switched on. At least one recording time in each measuring process, a parameter is recorded which is representative of an electrical current flowing through a measuring resistance Rm. Depending on the recorded parameter and the switched-on switch element(s), a fault or lack of fault is recognized in an inductive load L of an electromechanical converter in the full-bridge circuit. A duration for the checking is set such that during said duration an idle condition for the electromechanical converter is maintained.

22 Claims, 7 Drawing Sheets

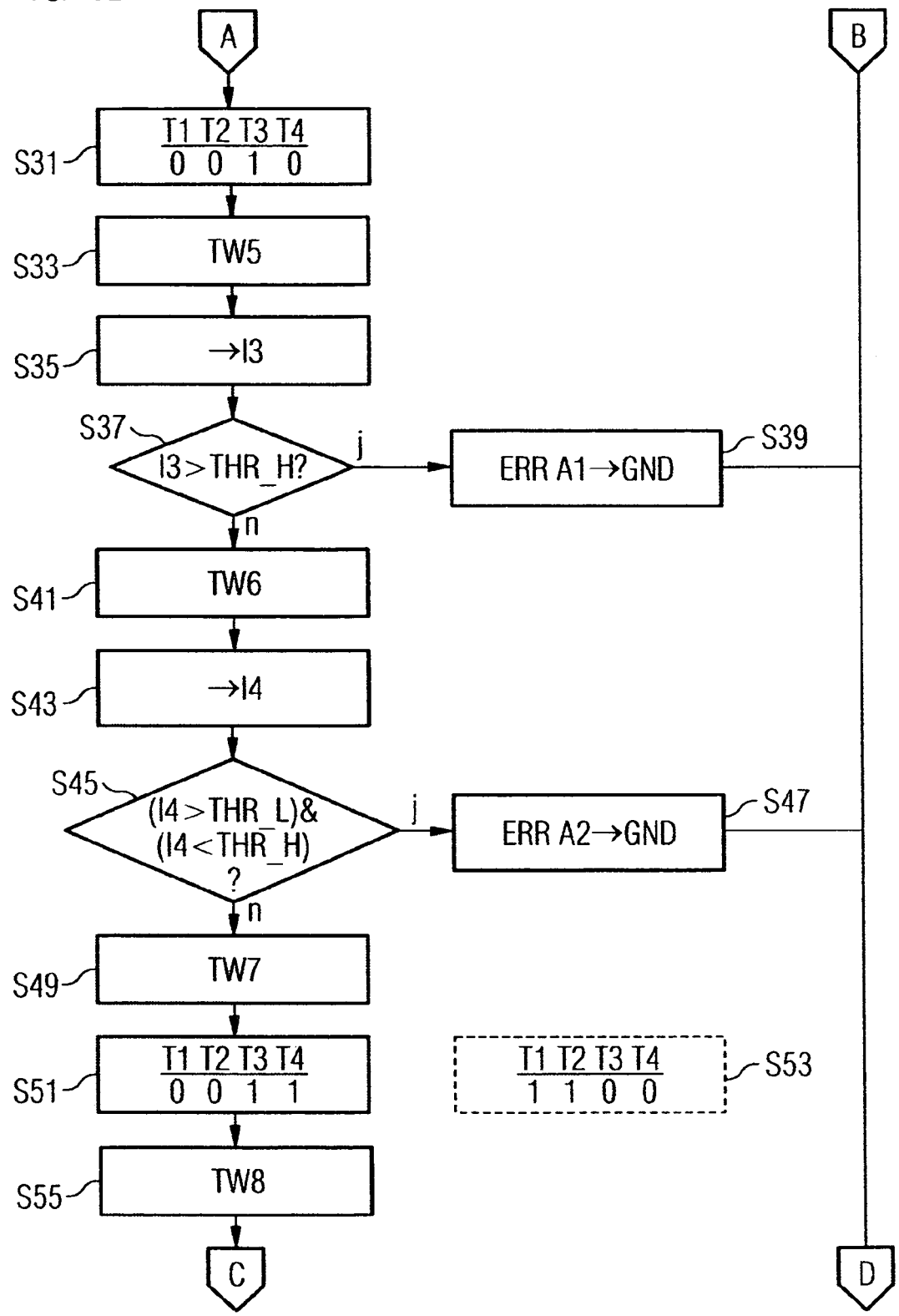

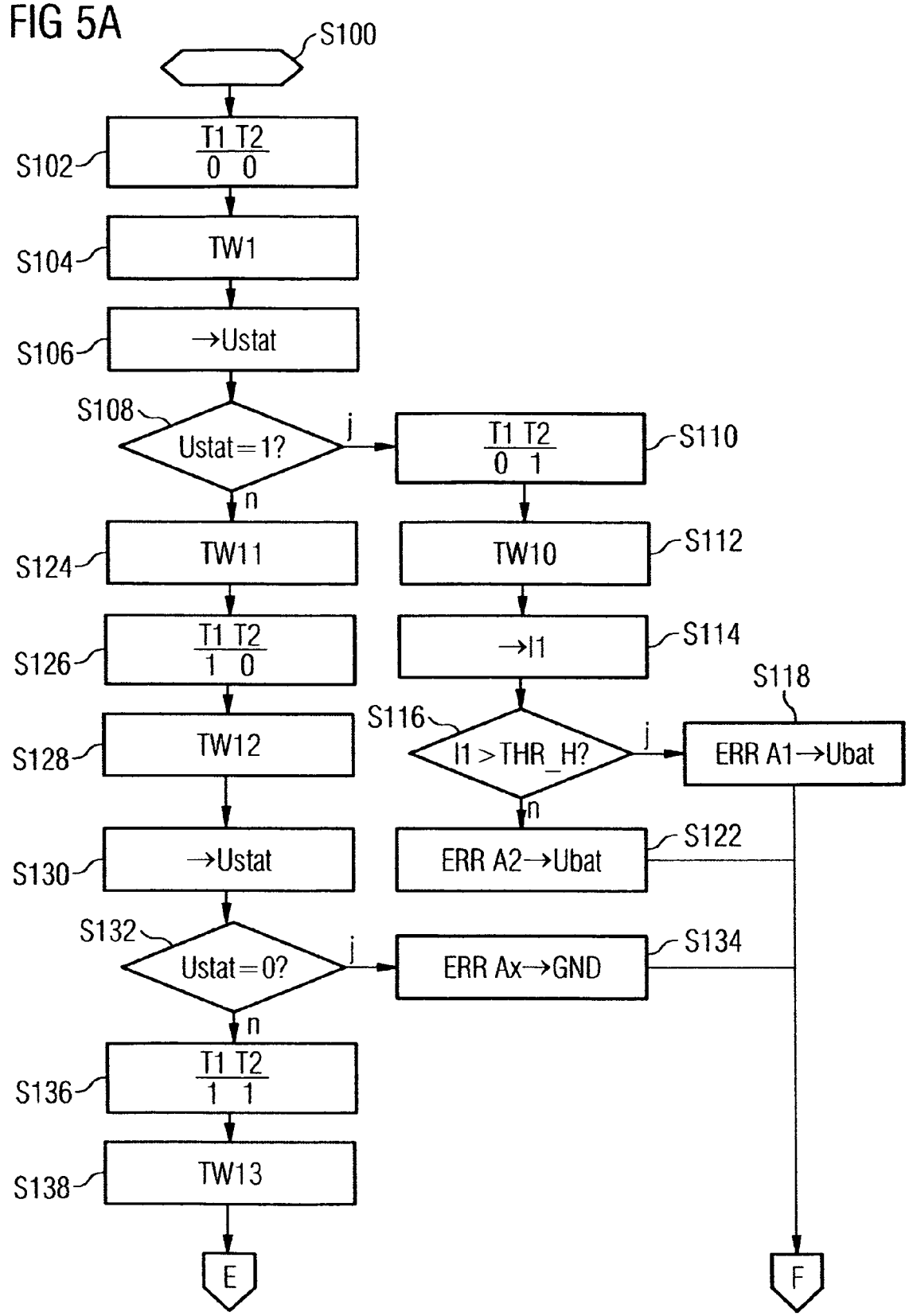

METHOD FOR CHECKING AN INDUCTIVE LOAD

CROSS REFERENCE TO RELATED APPLICATIONS

This is a U.S. national stage of application No. PCT/EP2006/064616, filed on 25 Jul. 2006. Priority is claimed on German Application No. 10 2005 036 769.0, filed 4 Aug. 2005, the content of which is incorporated here by reference.

BACKGROUND OF THE INVENTION

1. Field of the Invention

The invention relates to a method for checking an inductive load on an electromechanical transducer, in particular a valve with an electromagnetic actuator, in a full-bridge circuit or in a half-bridge circuit.

2. Description of the Prior Art

Valves with an electromagnetic actuator, which are used by way of example in motor vehicles, are subject to stringent safety and reliability requirements. In order to allow reliable and safe operation of the motor vehicle to be ensured, it must be possible to electrically check the valves so that faults, for example shorting or an interruption in a supply line, can be identified.

SUMMARY OF THE INVENTION

An object of the invention is to provide a simple and reliable method for checking an inductive load on an electromechanical transducer in a full-bridge circuit or in a half-bridge circuit.

According to one embodiment, the invention is distinguished by a method for checking an inductive load on an electromechanical transducer in a full-bridge circuit. The full-bridge circuit comprises a first, second, third and fourth switching element. The third and the second switching element form a first series circuit, and the first and the fourth switching element form a second series circuit. The first and the second series circuit are arranged electrically in parallel with one another between a supply potential and a reference ground potential. The first and the third switching element are coupled to the supply potential, and the second and the fourth switching element are coupled to the reference ground potential. The inductive load is electrically coupled at a first connection via a measurement resistor to a center tap of the first series circuit, and is electrically coupled at a second connection to a center tap of the second series circuit. In the method, the check comprises at least one measurement process. Within the at least one measurement process, in each case either only the second or only the third switching element is switched on or only the first and the second switching element are switched on, or only the third and the fourth switching element are switched on. At least one detection time within the respective measurement process, a variable is detected which is representative of an electric current which is flowing through the measurement resistor. A fault or soundness of the inductive load in the full-bridge circuit is identified depending on the detected variable and the respectively switched-on switching element or the respectively switched-on switching elements. A time period for the check is predetermined such that the electromechanical transducer remains in a rest position within this time period.

The invention is based on the discovery that the rest position of the electromechanical transducer, for example a valve with an electromagnetic actuator or an electric motor, is departed from when a minimum current level flows through the inductive load for a minimum time period. However, the check of the inductive load should not lead to the electromechanical transducer being changed from its rest position in order to ensure that the check of the inductive load has no undesirable effects resulting from the electromechanical transducer being moved away from its rest position, for example the production of noise. The time period for the check of the inductive load is therefore predetermined such that it is less than the minimum time period. A further advantage is that this allows the check of the inductive load to be carried out very quickly, for example within a few milliseconds.

The invention is also based on the discovery that the current rise when a current flows between the supply potential and the reference ground potential, with this current being limited only by the measurement resistor, is greater than the current rise in the case of a current flow which is additionally restricted by the inductive load. Furthermore, the aim is for a current to flow through the inductive load and the measurement resistor in the full-bridge circuit only when the first and the second switching element or the third and the fourth switching element are switched on.

A further advantage is that the circuitry of the full-bridge circuit need not be modified in order to allow the method for checking the inductive load to be carried out. Faults in the inductive load or a coupling state of the inductive load in the full-bridge circuit can therefore be identified easily and reliably.

In a further embodiment of the method, shorting of the first connection to the supply potential is identified when only the second switching element is switched on and the magnitude of the detected variable is greater than a predetermined upper threshold value. The predetermined upper threshold value may be dependent on the respective detection time or the inductive load. The advantage is that the method is very simple and, if the predetermined upper threshold value is preset appropriately, allows reliable identification of shorting of the first connection to the supply potential.

In yet a further embodiment the method, shorting of the second connection to the supply potential is identified when only the second switching element is switched on and the magnitude of the detected variable is greater than a predetermined lower threshold value and less than the predetermined upper threshold value. The predetermined lower threshold value may be predetermined as a function of the respective detection time or of the inductive load, in the same way as the predetermined upper threshold value. The advantage is that the method is very simple and that shorting of the second connection to the supply potential can be identified reliably if the predetermined upper and lower threshold values are preset appropriately.

In another embodiment of the method, shorting of the first connection to the reference ground potential is identified when only the third switching element is switched on and the magnitude of the detected variable is greater than the predetermined upper threshold value. The advantage is that the method is very simple and that the shorting of the first connection to the reference ground potential can be identified reliably if the predetermined upper threshold value is preset appropriately.

In yet another embodiment of the method, shorting of the second connection to the reference ground potential is identified when only the third switching element is switched on and the magnitude of the detected variable is greater than the predetermined lower threshold value and less than the predetermined upper threshold value. The advantage is that the method is very simple and that shorting of the second connection to the reference ground potential can be identified reliably if the predetermined upper and lower threshold values are preset appropriately.

In a further embodiment of the method, shorting between the first and the second connection is identified when only the first and the second switching element or only the third and the fourth switching element are switched on, and the magnitude of the detected variable is greater than the predetermined upper threshold value. The advantage is that the method is very simple and that shorting between the first and the second connection can be identified reliably if the predetermined upper threshold value is preset appropriately.

In a further embodiment of the method, an interruption between the first and the second connection is identified when only the first and the second switching element or only the third and the fourth switching element are switched on, and the magnitude of the detected variable is less than the predetermined lower threshold value. This has the advantage that the method is very simple and that the interruption between the first and the second connection can be identified reliably if the predetermined lower threshold value is preset appropriately.

According to a further embodiment, the invention is distinguished by a method for checking an inductive load on an electromechanical transducer in a half-bridge circuit. The half-bridge circuit comprises a first and a second switching element. The first switching element is coupled to the supply potential, and the second switching element is coupled to the reference ground potential. The inductive load is electrically coupled at a first connection by a measurement resistor to the second switching element, and is electrically coupled at a second connection to the first switching element. In the method, the check comprises at least one measurement process. Within the at least one measurement process, in each case only the second switching element is switched on or the first and the second switching element are switched on. At least one detection time within the respective measurement process, a variable is detected which is representative of an electric current which is flowing through the measurement resistor. A fault or soundness of the inductive load in the half-bridge circuit is identified depending on the detected variable and the respectively switched-on switching element or the respectively switched-on switching elements. A time period for the check is predetermined such that the electromechanical transducer remains in a rest position within this time period.

The advantages of the method correspond to those of the method for checking the inductive load on the electromechanical transducer in the full-bridge circuit.

In one advantageous embodiment of the method, shorting of the first connection to the supply potential is identified when only the second switching element is switched on and the magnitude of the detected variable is greater than a predetermined upper threshold value. The advantage is that the method is very simple and that shorting of the first connection to the supply potential can be identified reliably if the predetermined upper threshold value is preset appropriately.

In a further embodiment of the method, shorting of the second connection to the supply potential is identified when only the second switching element is switched on and the magnitude of the detected variable is greater than a predetermined lower threshold value and less than the predetermined upper threshold value. The advantage is that the method is very simple and that shorting of the second connection to the supply potential can be identified reliably if the predetermined upper and lower threshold values are preset appropriately.

In yet a further embodiment of the method, shorting between the first and the second connection is identified when the first and the second switching element are switched on and the magnitude of the detected variable is greater than the predetermined upper threshold value. The advantage is that the method is very simple and that shorting between the first and the second connection can be identified reliably if the predetermined upper threshold value is preset appropriately.

In another embodiment of the method, an interruption between the first and the second connection is identified when the first and the second switching element are switched on and the magnitude of the detected variable is less than the predetermined lower threshold value. The advantage is that the method is very simple and that the interruption between the first and the second connection can be identified reliably if the lower threshold value is preset appropriately.

In yet another embodiment of the method, the half-bridge circuit has a parallel resistor which is arranged electrically in parallel with the inductive load. The signal level at the first connection is detected at the at least one detection time. Shorting of the first or of the second connection to the reference ground potential is identified when only the first switching element is switched on and the detected signal level corresponds to the reference ground potential. The advantage is that the method is very simple and that shorting of the first or of the second connection to the reference ground potential can be reliably identified simply by adding the parallel resistor to the half-bridge circuit.

BRIEF DESCRIPTION OF THE DRAWINGS

Exemplary embodiments of the invention will be explained in the following text with reference to the schematic drawings, in which.

DETAILED DESCRIPTION OF THE PREFERRED EMBODIMENTS

Elements with the same design or function are provided with the same reference symbols throughout all the figures.

Figure 1:
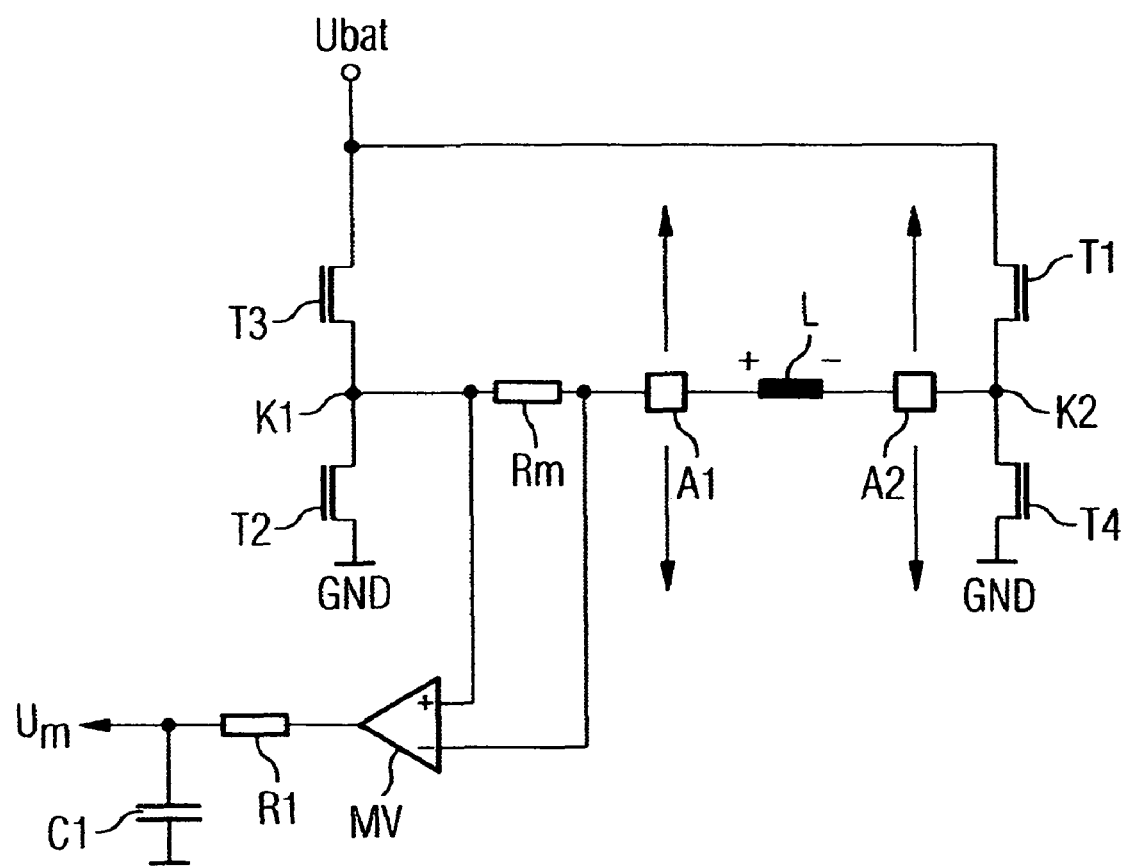
FIG. 1 is a schematic diagram of a full-bridge circuit in which an embodiment of the invention is implemented.

A full-bridge circuit comprises a first, second, third and fourth switching element T1, T2, T3, T4 which, for example, are in the form of transistors and can be operated by a control unit, which is not illustrated (FIG. 1). The third and the second switching element T3, T2 form a first series circuit and the first and the fourth switching element T1, T4 form a second series circuit, which are electrically arranged between a supply potential Ubat and reference ground potential GND. The first and the third switching element T1, T3 are for this purpose coupled to the supply potential Ubat, and the second and the fourth switching element T2, T4 are coupled to the reference ground potential GND.

A center tap K1 is provided on the first series circuit electrically between the third and the second switching element T3, T2, and a center tap K2 is provided on the second series circuit, electrically between the first and the fourth switching element. An inductive load L is coupled at a first connection A1 via a measurement resistor Rm to the center tap K1 on the first series circuit. The inductive load L is also coupled via a second connection A2 to the center tap K2 of the second series circuit.

A measurement voltage is tapped off across the measurement resistor Rm, and is amplified by a measurement amplifier MV. The amplified measurement voltage may be smoothed by an RC element, which is formed by a first resistor R1 and a first capacitor C1, and, for example, can be supplied to the control unit. By way of example, the control unit is designed to appropriately operate the first, second, third or fourth switching element T1, T2, T3, T4 as a function of the measurement voltage Um, in order to operate the inductive load. By way of example, the measurement voltage Um is a variable which is representative of an electric current I flowing through the measurement resistor Rm.

The inductive load L is, for example, formed by an electromechanical transducer, for example by a valve with an electromagnetic actuator or an electric motor. An electromechanical transducer such as this has, for example, an armature which can be deflected from a rest position when a suitable current flows through the inductive layer L, for example in order to open or close the valve or in order to rotate the rotor of the electric motor. In order to deflect the armature from the rest position, a minimum current level must flow through the inductive load for a minimum time period in order to produce a magnetic field of adequate strength. For example, the minimum time period is about 30 milliseconds.

However, when checking the inductive load L in the full-bridge circuit, the armature should remain in its rest position in order to prevent undesirable effects, which may be caused by deflection of the electromechanical transducer from the rest position. For this purpose, the first, the second, the third or the fourth switching element T1, T2, T3, T4 is switched on only briefly, for example for a few milliseconds, in order to allow measurements. The check of the inductive load L in the full-bridge circuit must be completed before the electric current I through the inductive load L has become sufficiently great that the electromechanical transducer is deflected from its rest position.

By way of example, the check of the inductive load L in the full-bridge circuit may be subdivided into one or more measurement processes, which are carried out successively in a rapid sequence, or at a relatively long time interval from one another. The time period for the check is in this case predetermined such that the electromechanical transducer remains in its rest position throughout this time period. For example, the time period for the check is a maximum of ten to twenty milliseconds.

Within the respective measurement process, the measurement voltage Um is detected at least one detection time. The inductive load in the full-bridge circuit is identified as being faulty or sound on the basis of the measurement voltage Um in the switching element which is switched on in the respective measurement process. Faults include, for example, shorting of the first or of the second connection A1, A2 to the supply potential Ubat or to the reference ground potential GND, or shorting or an interruption between the first and the second connection A1, A2.

Figure 2:
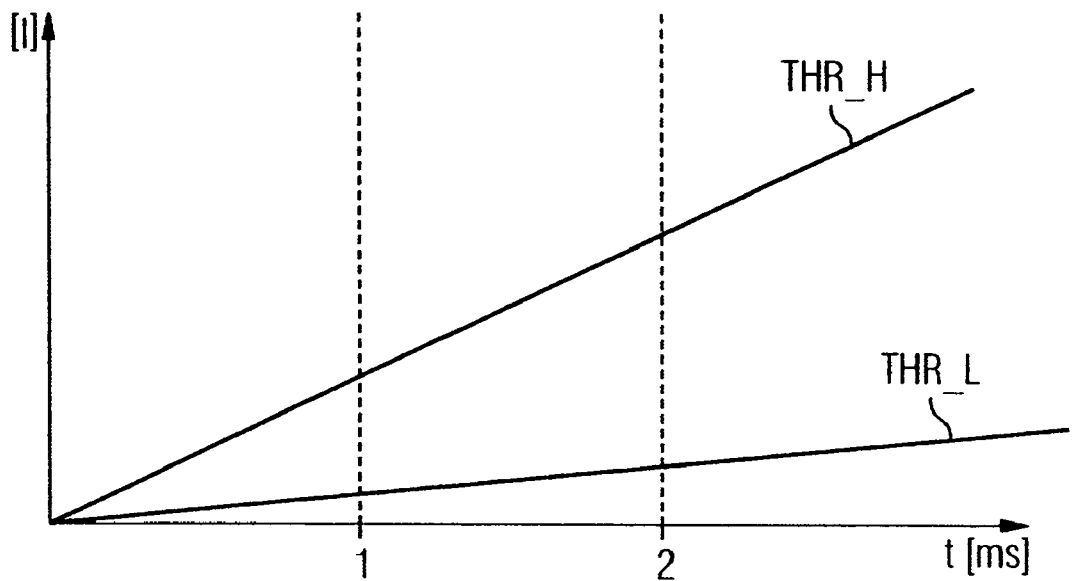
FIG. 2 is a current/time diagram.

Shorting of the first connection A1 to the supply potential Ubat can be identified by only the second switching element T2 being switched on and by detection of the measurement voltage Um at the at least one detection time which, for example, occurs one millisecond after the second switching element T2 has been switched on. This short causes a large current to flow through the measurement resistor Rm, and therefore a measurement voltage Um with a large magnitude. In particular, the electric current I through the measurement resistor Rm is not restricted by the inductive load L. This short can therefore be identified very easily if the magnitude of the electric current I, or of the measurement voltage Um which represents it, is greater than a predetermined upper threshold value THR_H (FIG. 2). The predetermined upper threshold value THR_H is preferably predetermined to be dependent on the respective detection time. This ensures that the predetermined upper threshold value THR_H is exceeded only when the electric current I is not being restricted by the inductive load L. In consequence, the predetermined upper threshold value THR_H preferably in each case rises as well after the second switching element T2 has been switched on, corresponding to the electric current I which is restricted by the inductive load L, even if the electric current I is not actually restricted by the inductive load L.

Shorting of the second connection A2 to the supply potential Ubat can be identified by only the second switching element T2 being switched on and by detection of the measurement voltage Um at the at least one detection time. The electric current I flowing through the measurement resistor Rm is then restricted by the inductive load L, so that any rise in the magnitude of the electric current I as a function of the inductive load L takes place more slowly than if the first connection A1 were to be shorted to the supply potential Ubat. Shorting of the second connection A2 to the supply potential Ubat can be identified very easily if the magnitude of the electric current I, or of the measurement voltage Um which represents it, is less than the predetermined upper threshold value THR_H and is greater than a predetermined lower threshold value THR_L. The predetermined lower threshold value THR_L may also be predetermined as function of the respective detection time.

However, if neither the first connection A1 nor the second connection A2 is shorted to the supply potential Ubat, then the magnitude of the electric current I remains less than the predetermined lower threshold value THR_L.

A check can be carried out in the corresponding manner to determine whether the first connection A1 or the second connection A2 is shorted to the reference ground potential GND. For this purpose, only the third switching element T3 is switched on, and the measurement voltage Um is detected at the at least one detection time. Shorting of the first connection A1 to the reference ground potential GND is identified if the magnitude of the electric current I, or of the measurement voltage Um which represents it, exceeds the predetermined upper threshold value THR_H. Shorting of the second connection A2 to the reference ground potential GND is identified if the magnitude of the electric current I, or of the measurement voltage Um which represents it, is less than the predetermined upper threshold value THR_H and is greater than the predetermined lower threshold value THR_L. Shorting of the first connection A1 or of the second connection A2 to the reference ground potential GND does not take place, however, if the magnitude of the electric current I, or of the measurement voltage Um which represents it, is less than the predetermined lower threshold value THR_L.

In order to identify shorting between the first and the second connection A1, A2 or an interruption between the first and the second connection A1, A2, either only the first and the second switching element T1, T2 or only the third and the fourth switching element T3, T4 are switched on. If there is a short between the first and second connection A1, A2, the electric current I through the measurement resistor Rm is not restricted by the inductive load L. This short is identified in a corresponding manner if the magnitude of the electric current I, or of the measurement voltage Um which represents it, is greater than the predetermined upper threshold value THR_H. An interruption between the first and the second connection A1, A2 is identified if the magnitude of the electric current I, or of the measurement voltage Um which represents it, is less than the predetermined lower threshold value THR_L. However, there is no short or interruption between the first and the second connection A1, A2 if the magnitude of the electric current I, or of the measurement voltage Um which represents it, is less than the predetermined upper threshold value THR_H and greater than the predetermined lower threshold value THR_L.

Soundness of the inductive load L in the full-bridge circuit is identified when the first connection A1 is not shorted to the supply potential Ubat or to the reference ground potential GND, the second connection A2 is not shorted to the supply potential Ubat or to the reference ground potential GND, and no short or interruption is identified between the first and the second connection A1, A2.

Figure 4A:
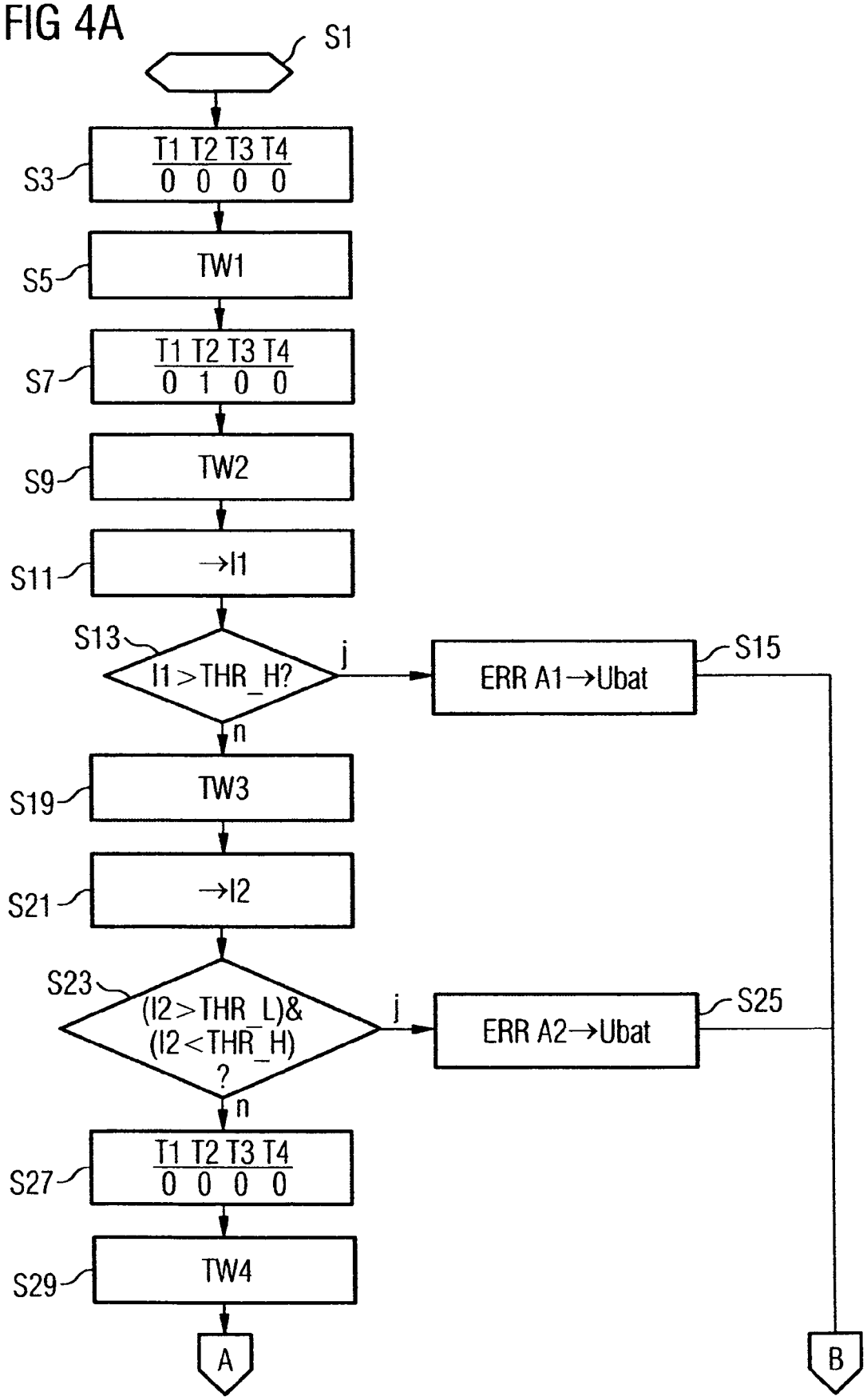
FIGS. 4a, b, c is a flowchart of a program for checking the inductive load on an electromechanical transducer in a full-bridge circuit, and FIGS. 5a, b is a flowchart of a program for checking the inductive load on the electromechanical transducer in a half-bridge circuit.
Figure 4C:
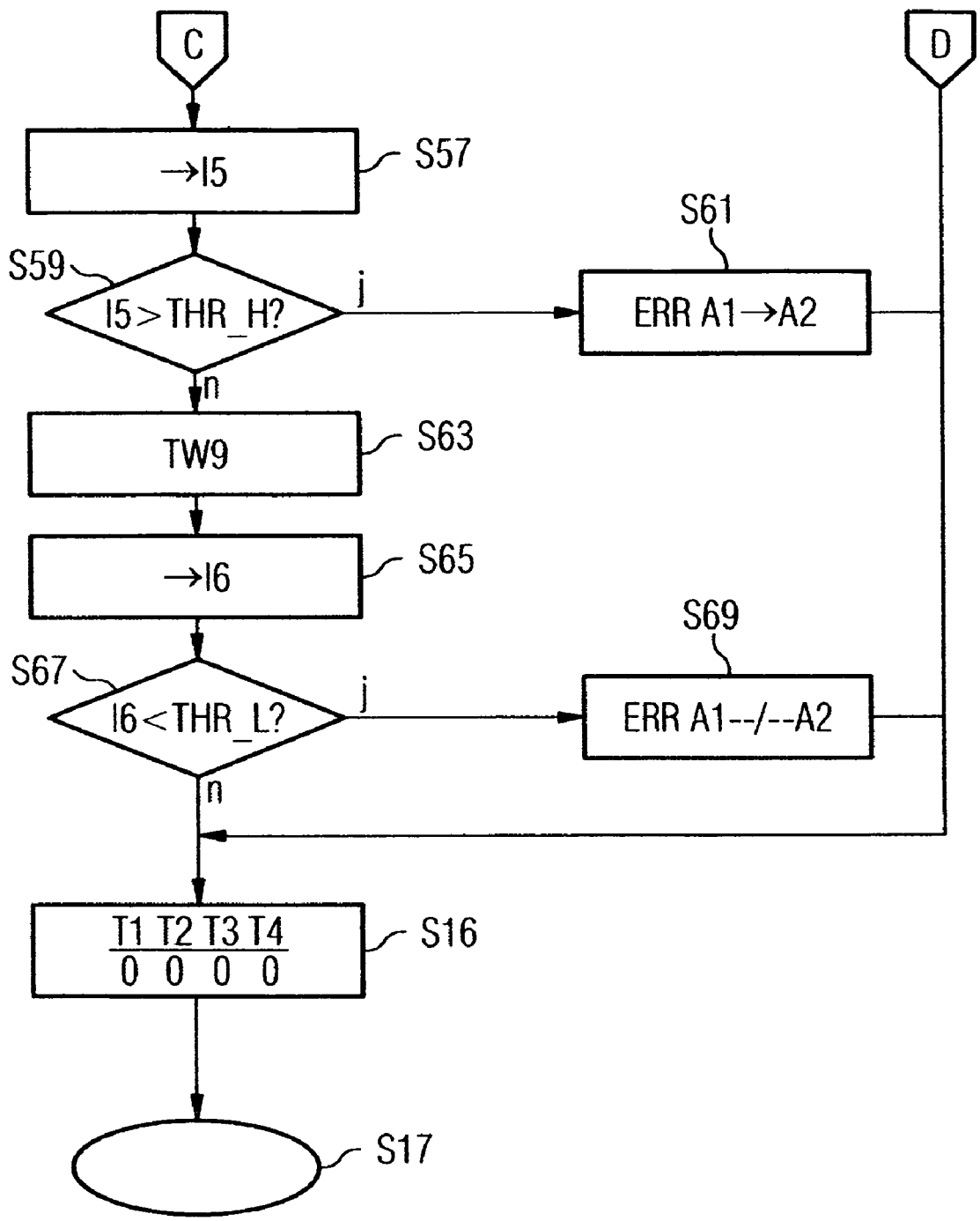

FIGS. 4a, 4b and 4c show a flowchart of a first program which, for example, is run by the control unit. The first program comprises steps of a method for checking the inductive load on the electromechanical transducer in the full-bridge circuit. The first program starts with a step S1. The first, the second, the third and the fourth switching element T1, T2, T3, T4 are switched off in a step S3. A first waiting time period TW1 is allowed to pass in a step S5. The waiting time period TW1 is preferably chosen such that any magnetic field of the inductive load which may be present has been essentially completely dissipated. The first waiting time period TW1 is dependent on the inductive load L and is, for example, about 50 milliseconds.

The second switching element T2 is switched on in a step S7. A second waiting time period TW2 is allowed to pass in a step S9. A first current I1 flowing through the measurement resistor Rm is detected in a step S11. The first current I1 may also be represented by the corresponding measurement voltage Um or by some other variable which is representative of the electric current I flowing through the measurement resistor Rm.

A check is carried out in a step S13 to determine whether the first current I1 is greater than the predetermined upper threshold value THR_H. If this condition is satisfied, then shorting of the first connection A1 to the supply potential Ubat is identified as a fault in the step S15, and the first program continues in a step S16. The first, the second, the third and the fourth switching element T1, T2, T3, T4 are switched off in the step S16. The first program ends at a step S17.

However, if the condition in Step S13 is not satisfied, then a third waiting time period TW3 is allowed to pass in a step S19. A second current I2 is detected in a step S21. A check is carried out in a step S23 to determine whether the second current I2 is greater than the predetermined lower threshold value THR_L and less than the predetermined upper threshold value THR_H. If the condition is satisfied, then the shorting of the second connection A2 to the supply potential Ubat is identified as a fault in a step S25, and the first program is continued in the step S16, and ends at the step S17.

If the condition in the step S23 is not satisfied, then the first, the second, the third and the fourth switching element T1, T2, T3, T4 are switched off in a step S27, and a fourth waiting time period TW4 is allowed to pass in the step S29. The third switching element T3 is switched on in a step S31. A fifth waiting time period TW5 is allowed to pass in a step S33, and a third current I3 is detected in a step S35. A check is carried out in a step S37 to determine whether the third current I3 is greater than the predetermined upper threshold value THR_H. If the condition is satisfied, then shorting of the first connection A1 to the reference ground potential GND is identified as a fault in a step S39, and the first program is continued in the step S16, and ends at the step S17.

However, if the condition in the step S37 is not satisfied, then a sixth waiting time period TW6 is allowed to pass in a step S41, and a fourth current I4 is detected in a step S43. A check is carried out in a step S45 to determine whether the fourth current I4 is greater than the predetermined lower threshold value THR_L and less than the predetermined upper threshold value THR_H. If the condition is satisfied then shorting of the second connection A2 to the reference ground potential GND is identified as a fault in a step S47, and the first program is continued in the step S16, and ends at the step S17.

However, if the condition in the step S45 is not satisfied, then a seventh waiting time period TW7 is allowed to pass in a step S49. The third and the fourth switching element T3, T4 are switched on in a step S51. As an alternative to the step S51, the first and the second switching element T1, T2 can be switched on in a step S53. An eighth waiting time period TW8 is allowed to pass in a step S55. A fifth current I5 is detected in a step S57. A check is carried out in a step 59 to determine whether the fifth current I5 is greater than the predetermined upper threshold value THR_H. If the condition is satisfied, then shorting between the first and the second connection A1, A2 is identified as a fault in a step 61, and the first program is continued in the step S16, and ends at the step S17.

However, if the condition in step S59 is not satisfied, then a ninth waiting time period TW9 is allowed to pass in a step S63 and a sixth current I6 is detected in a step S65. A check is carried out in a step S67 to determine whether the sixth current I6 is less than the predetermined lower threshold value THR_L. If the condition is satisfied, then the interruption between the first and the second connection A1, A2 is identified as a fault in a step S69, and the first program is continued in the step S16, and ends at the step S17. However, if the condition in the step S67 is not satisfied, soundness is identified and the first program ends at the step S17, after carrying out the step S16. If soundness is identified, the electromechanical transducer can also be operated as desired, without the step S16 having previously been carried out.

Figure 3:
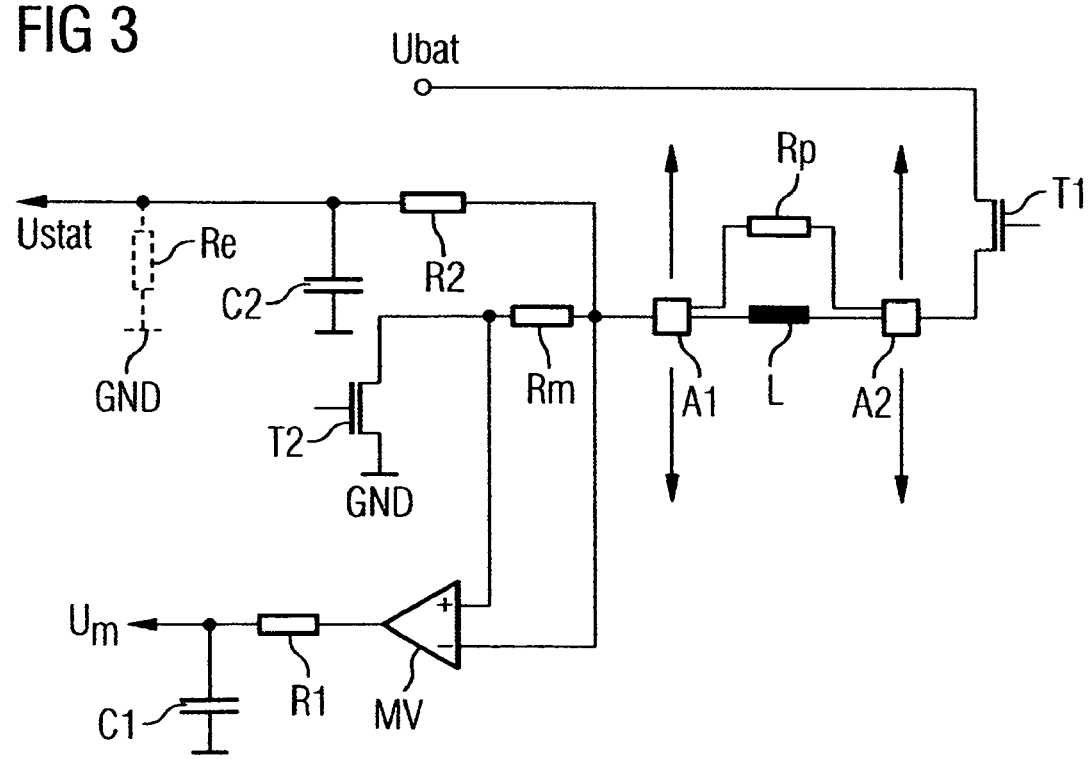
FIG. 3 is a half-bridge circuit in which a further embodiment of the invention is implemented.

A corresponding check of the inductive load L of the electromechanical transducer can also be carried out by operating the inductive load L in a half-bridge circuit (FIG. 3). A series circuit comprising the first switching element T1, the inductive load L, the measurement resistor Rm and the second switching element T2 is electrically arranged between the supply potential Ubat and the reference ground potential GND. Furthermore, the half-bridge circuit has a parallel resistor Rp, which is arranged electrically in parallel with the inductive load. The signal level at the first connection A1 may be supplied to the control unit as a status voltage Ustat via a further RC element, which comprises a second resistor R2 and a second capacitor C2. The status voltage Ustat is kept at the reference ground potential GND by an input resistor Re which, for example, is arranged in the control unit, until no other potential is assigned to the first connection A1.

Figure 5B:
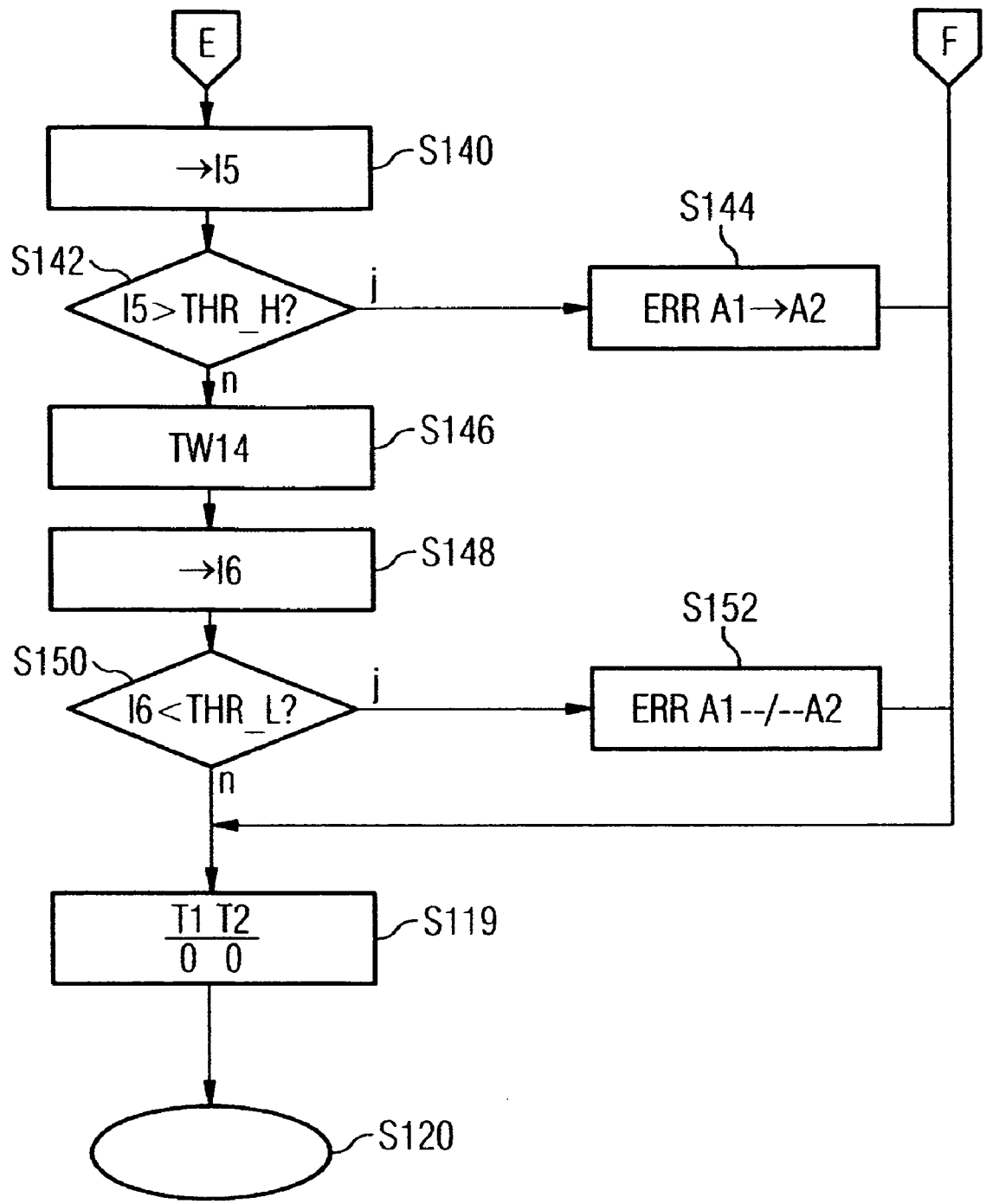

FIGS. 5a and 5b show a flowchart of a second program which, for example, is run by the control unit. The second program comprises steps of a method for checking the inductive load on the electromechanical transducer in the half-bridge circuit. The second program starts with a step S100. The first and the second switching element T1, T2 are switched off in a step S102. The first waiting time period TW1 is allowed to pass in a step S104.

The status voltage Ustat is detected in a step S106. A check is carried out in a step S108 to determine whether the status voltage is at a high level, that is to say it corresponds approximately to the supply potential Ubat. If the condition is satisfied, then the second switching element T2 is switched on in a step S110. A tenth waiting time period TW10 is allowed to pass in a step S112. The first current I1 is detected in a step S114. A check is carried out in a step S116 to determine whether the first current I1 is greater than the predetermined upper threshold value THR_H. If the condition is satisfied, then shorting of the first connection A1 to the supply potential Ubat is identified as a fault in the step S118, and the second program is continued in a step S119. The first and the second switching element T1, T2 are switched off in the step S119. The second program ends at a step S120. However, if the condition in the step S116 is not satisfied, then shorting of the second connection A2 to the supply potential Ubat is identified as a fault in a step S122, and the second program is continued in the step S119, and ends at the step S120.

However, if the condition in the step S108 is not satisfied, that is to say the status voltage Ustat is at a low level, that is to say it corresponds approximately to the reference ground potential GND, then an eleventh waiting time period TW11 is allowed to pass in a step S124. The first switching element T1 is switched on in a step S126. A twelfth waiting time period TW12 is allowed to pass in a step S128, and the status voltage Ustat is detected in a step S130. A check is carried out in a step S132 to determine whether the status voltage is at the low level. If this condition is satisfied, then shorting of the first or of the second connection A1, A2 to the reference ground potential GND is identified as a fault in the step S134, and the second program is continued in the step S119, and ends at the step S120.

However, if the condition in the step S132 is not satisfied, then the first and the second switching element T1, T2 are switched on in a step S136 and a thirteenth waiting time period TW13 is allowed to pass in a step S138. The fifth current I5 is detected in a step S140. A check is carried out in a step S142 to determine whether the fifth current I5 is greater than the predetermined upper threshold value THR_H. If this condition is satisfied, then shorting between the first and the second connection A1, A2 is identified as a fault in a step S144 and the second program is continued in the step S119, and ends at the step S120.

However, if the condition in the step S142 is not satisfied, then a fourteenth waiting time period TW14 is allowed to pass in a step S146, and the sixth current I6 is detected in a step S148. A check is carried out in a step S150 to determine whether the sixth current I6 is less than the predetermined lower threshold value THR_L. If this condition is satisfied, then an interruption between the first and the second connection A1, A2 is identified as a fault in a step S152, and the second program is continued in the step S119, and ends at the step S120. However, if the condition in the step S150 is not satisfied, then soundness is identified and the second program is ended at the step S120 after carrying out the step S119. If soundness is identified, the electromechanical transducer can also be operated as desired without the step S119 having previously been carried out.

The parallel resistor Rp makes it possible to distinguish between shorting of the first or of the second connection A1, A2 to the reference ground potential and an interruption between the first and the second connection A1, A2. The parallel resistor Rp allows the status voltage Ustat to be at a high level even when there is an interruption between the first and second connection A1, A2. In the step S130, the status voltage Ustat is therefore at a low level only when the first or the second connection A1, A2 is shorted to the reference ground potential. As an alternative to the parallel resistor Rp and tapping off the status voltage Ustat at the first connection A1, a further measurement resistor can also be arranged electrically between the second connection A2 and the first switching element T1, and a further measurement voltage can be detected which is representative of the electric current I flowing through the further measurement resistor. In this case, shorting of the first or of the second connection A1, A2 to the reference ground potential GND can also be identified by switching on only the first switching element T1 and by detection of the further measurement voltage, corresponding to the method for checking the inductive load on the electromechanical transducer in the full-bridge circuit.

The second to fourteenth waiting time period TW2-TW14 are each, for example, about one millisecond. These waiting time periods may, however, also be chosen to be shorter or longer, or to be different. In particular, the second to the fourteenth waiting time periods TW2-TW14 may be chosen as a function of the inductive load L or as a function of the resistance of the first resistor R1 and of the first capacitor C1, or of the second resistor R2 and of the second capacitor C2, in order to allow the first to sixth currents I1-I6 or the status voltage Ustat to be reliably detected. Furthermore, the sum of the second to ninth waiting time periods TW2-TW9 and the sum of the tenth to fourteenth waiting time periods TW10-TW14 are limited because the electromechanical transducer must remain in its rest position during the check.

What is claimed is:

1. A method for checking an inductive load on an electromechanical transducer in a full-bridge circuit which comprises first, second, third and fourth switching elements, the third and second switching elements forming a first series circuit and the first and fourth switching elements forming a second series circuit, the first and second series circuit being arranged electrically in parallel with one another between a supply potential and a reference ground potential, the first and third switching elements being coupled to the supply potential, and the second and fourth switching elements being coupled to the reference ground potential, and the inductive load being electrically coupled at a first connection through a measurement resistor to a first center tap of the first series circuit, and being electrically coupled at a second connection to a second center tap of the second series circuit, the method of checking comprising the steps of:

performing at least one measurement process by setting the first through fourth switching elements to effect one switching arrangement from the set of switching arrangements consisting of either only the second or only the third switching element is switched on, only the first and the second switching element are switched on, or only the third and the fourth switching element are switched on, detecting a variable representative of an electric current which is flowing through the measurement resistor, identifying a fault or soundness of the inductive load in the full-bridge circuit depending on the detected variable and the one switching arrangement, and predetermining a time period for the steps of performing the at least one measurement process such that the time period is less than a minimum time period for which a minimum current level must flow through the inductive load for causing a deflection of the electromechanical transducer from its rest position, such that the electromechanical transducer remains in the rest position throughout the time period.

2. The method of claim 1, wherein the step of identifying comprises identifying shorting of the first connection to the supply potential when only the second switching element is switched on and the magnitude of the detected variable is greater than a predetermined upper threshold value.

3. The method of claim 2, wherein the step of identifying comprises identifying shorting of the second connection to the supply potential when only the second switching element is switched on and the magnitude of the detected variable is greater than a predetermined lower threshold value and less than the predetermined upper threshold value.

4. The method of claim 3, wherein the step of identifying comprises identifying shorting of the first connection to the reference ground potential when only the third switching element is switched on and the magnitude of the detected variable is greater than the predetermined upper threshold value.

5. The method of claim 4, wherein the step of identifying comprises identifying shorting of the second connection to the reference ground potential when only the third switching element is switched on and the magnitude of the detected variable is greater than the predetermined lower threshold value and less than the predetermined upper threshold value.

6. The method of claim 5, wherein the step of identifying comprises identifying shorting between the first and the second connection when only the first and the second switching element or only the third and the fourth switching element are switched on, and the magnitude of the detected variable is greater than the predetermined upper threshold value.

7. The method of claim 6, wherein the step of identifying comprises identifying an interruption between the first and second connection when only the first and the second switching element or only the third and the fourth switching element are switched on, and the magnitude of the detected variable is less than the predetermined lower threshold value.

8. The method of claim 1, wherein the step of identifying comprises identifying shorting of the second connection to the supply potential when only the second switching element is switched on and the magnitude of the detected variable is greater than a predetermined lower threshold value and less than a predetermined upper threshold value.

9. The method of claim 1, wherein the step of identifying comprises identifying shorting of the first connection to the reference ground potential when only the third switching element is switched on and the magnitude of the detected variable is greater than a predetermined upper threshold value.

10. The method of claim 1, wherein the step of identifying comprises identifying shorting of the second connection to the reference ground potential when only the third switching element is switched on and the magnitude of the detected variable is greater than a predetermined lower threshold value and less than a predetermined upper threshold value.

11. The method of claim 1, wherein the step of identifying comprises identifying shorting between the first and the second connection when only the first and the second switching element or only the third and the fourth switching element are switched on, and the magnitude of the detected variable is greater than a predetermined upper threshold value.

12. The method of claim 1, wherein the step of identifying comprises identifying an interruption between the first and second connection when only the first and the second switching element or only the third and the fourth switching element are switched on, and the magnitude of the detected variable is less than a predetermined lower threshold value.

13. A method for checking an inductive load on an electromechanical transducer in a half-bridge circuit which comprises a first and a second switching element, the first switching element being coupled to the supply potential and with the second switching element being coupled to the reference ground potential, and the inductive load being electrically coupled at a first connection through a measurement resistor to the second switching element, and being electrically coupled at a second connection to the first switching element, the method comprising the steps of:
performing at least one measurement process by setting the first and second switching elements to effect one switching arrangement from the set of switching arrangements consisting of only the second switching element is switched on or both the first and second switching elements are switched on,
detecting variable representative of an electric current which is flowing through the measurement resistor at least one detection time within the at least one measurement process,
identifying a fault or soundness of the inductive load in the half-bridge circuit depending on the detected variable and the one switching arrangement, and
predetermining a time period for the steps of performing the at least one measurement process such that the time period is less than a minimum time period for which a minimum current level must flow through the inductive load for causing a deflection of the electromechanical transducer from its rest position, such that the electromechanical transducer remains in the rest position throughout the time period.

14. The method of claim 13, wherein the step of identifying comprises identifying shorting of the first connection to the supply potential when only the second switching element is switched on and the magnitude of the detected variable is greater than a predetermined upper threshold value.

15. The method of claim 14, wherein the step of identifying comprises identifying shorting of the second connection to the supply potential when only the second switching element is switched on and the magnitude of the detected variable is greater than a predetermined lower threshold value and less than the predetermined upper threshold value.

16. The method of claim 15, wherein the step of identifying comprises identifying shorting between the first and the second connection when the first and second switching elements are switched on and the magnitude of the detected variable is greater than the predetermined upper threshold value.

17. The method of claim 16, wherein the step of identifying comprises identifying an interruption between the first and the second connection when the first and second switching elements are switched on and the magnitude of the detected variable is less than the predetermined lower threshold value.

18. The method of claim 17, wherein the half-bridge circuit has a parallel resistor arranged electrically in parallel with the inductive load, and a signal level at the first connection is detected at the at least one detection time, and wherein the step of identifying comprises identifying shorting of the first connection or the second connection to the reference ground potential when only the first switching element is switched on and the detected signal level corresponds to the reference ground potential.

19. The method of claim 13, wherein the step of identifying comprises identifying shorting of the second connection to the supply potential when only the second switching element is switched on and the magnitude of the detected variable is greater than a predetermined lower threshold value and less than a predetermined upper threshold value.

20. The method of claim 13, wherein the step of identifying comprises identifying shorting between the first and the second connection when the first and second switching elements are switched on and the magnitude of the detected variable is greater than a predetermined upper threshold value.

21. The method of claim 13, wherein the step of identifying comprises identifying an interruption between the first and the second connection when the first and second switching elements are switched on and the magnitude of the detected variable is less than a predetermined lower threshold value.

22. The method of claim 13, wherein the half-bridge circuit has a parallel resistor arranged electrically in parallel with the inductive load, and a signal level at the first connection is detected at the at least one detection time, and wherein the step of identifying comprises identifying shorting of the first connection or the second connection to the reference ground potential when only the first switching element is switched on and the detected signal level corresponds to the reference ground potential.

* * * * *